(12) United States Patent
Kim et al.

(10) Patent No.: US 10,134,779 B2
(45) Date of Patent: Nov. 20, 2018

(54) DISPLAY DEVICE HAVING SHORT CIRCUIT PREVENTION PATTERN

(71) Applicant: Samsung Display Co., Ltd., Yongin-si (KR)

(72) Inventors: Deukjong Kim, Yongin-si (KR); Jaehak Lee, Yongin-si (KR); Donghyun Lee, Yongin-si (KR); Byungsun Kim, Yongin-si (KR); Yangwan Kim, Yongin-si (KR); Sunja Kwon, Yongin-si (KR); Hyunae Park, Yongin-si (KR); Hyungjun Park, Yongin-si (KR); Sujin Lee, Yongin-si (KR); Jaeyong Lee, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/684,735

(22) Filed: Aug. 23, 2017

(65) Prior Publication Data
US 2018/0090518 A1 Mar. 29, 2018

(30) Foreign Application Priority Data
Sep. 28, 2016 (KR) .................. 10-2016-0124812

(51) Int. Cl.
*H01L 27/12* (2006.01)
*H01L 27/32* (2006.01)
*H01L 51/00* (2006.01)

(52) U.S. Cl.
CPC ...... *H01L 27/1244* (2013.01); *H01L 27/3258* (2013.01); *H01L 27/3262* (2013.01);
(Continued)

(58) Field of Classification Search
None
See application file for complete search history.

(56) References Cited

U.S. PATENT DOCUMENTS 8,791,455 B2 * 7/2014 Kim .................... H01L 27/3237
257/40
2014/0077176 A1 * 3/2014 Lee ..................... H01L 27/3262
257/40

(Continued)

FOREIGN PATENT DOCUMENTS

KR 10-2014-0045193 4/2014
KR 10-2014-0099164 8/2014
(Continued)

*Primary Examiner* — Bilkis Jahan
(74) *Attorney, Agent, or Firm* — H.C. Park & Associates, PLC

(57) ABSTRACT

A display device including a substrate including a bending area arranged between a first area and a second area, the substrate being configured to be bent around a bending axis extending in a first direction, a first inorganic insulating layer disposed on the substrate and having a first opening overlapping the bending area, a first organic layer disposed in the first opening, and a plurality of first conductive layers disposed on the first organic layer and extending from the first area to the second area through the bending area, in which wherein at least one edge of the first organic layer overlapping the first conductive layers includes at least one first short circuit prevention pattern.

20 Claims, 11 Drawing Sheets

(52) U.S. Cl.
CPC ...... *H01L 27/3276* (2013.01); *H01L 27/1218* (2013.01); *H01L 27/1248* (2013.01); *H01L 51/0097* (2013.01); *H01L 2251/5338* (2013.01)

(56) References Cited

U.S. PATENT DOCUMENTS

| | | | | |
|---|---|---|---|---|
| 2014/0226100 | A1* | 8/2014 | Kim | G02F 1/134363 |
| | | | | 349/43 |
| 2015/0179728 | A1* | 6/2015 | Kwon | H01L 27/3276 |
| | | | | 257/40 |
| 2015/0236044 | A1* | 8/2015 | Kim | H01L 27/124 |
| | | | | 257/72 |
| 2015/0311473 | A1* | 10/2015 | Kim | H01L 51/0011 |
| | | | | 257/40 |
| 2016/0020424 | A1* | 1/2016 | Kim | H01L 51/5056 |
| | | | | 257/40 |
| 2016/0079336 | A1* | 3/2016 | Youn | H01L 23/4985 |
| | | | | 257/40 |
| 2016/0163737 | A1* | 6/2016 | Guo | H01L 27/1259 |
| | | | | 257/72 |

FOREIGN PATENT DOCUMENTS

| | | |
|---|---|---|
| KR | 10-2014-0103025 | 8/2014 |
| KR | 10-2015-0074808 | 7/2015 |
| WO | 2014/126403 | 8/2014 |

\* cited by examiner

DISPLAY DEVICE HAVING SHORT CIRCUIT PREVENTION PATTERN

CROSS-REFERENCE TO RELATED APPLICATION

This application claims priority from and the benefit of Korean Patent Application No. 10-2016-0124812, filed on Sep. 28, 2016, which is hereby incorporated by reference for all purposes as if fully set forth herein.

BACKGROUND

Field

Exemplary embodiments relate to a display device, and more particularly, to a flexible display device.

Discussion of the Background

In general, display devices may be used in mobile devices, such as smartphones, laptop computers, digital cameras, camcorders, portable information terminals, notebook computers, or tablet personal computers, or in electronic devices, such as desktop computers, televisions, outdoor advertisement boards, display devices, dashboards for vehicles, or head-up displays (HUDs).

Recently, a display apparatus is formed to be slim. Flexible display devices may be applied to portable apparatuses having various shapes. Among them, flexible display devices based on organic light-emitting display technology have gained much attention.

The flexible display device may generally be bent in one direction. However, a thin film of a flexible display device may easily be damaged, such as defects or a crack formed in a metal film disposed on a substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of preventing a crack in a metal film disposed on a substrate.

Additional aspects will be set forth in the detailed description which follows, and, in part, will be apparent from the disclosure, or may be learned by practice of the inventive concept.

According to an exemplary embodiment, a display device includes a substrate including a bending area arranged between a first area and a second area, the substrate being configured to be bent around a bending axis extending in a first direction, a first inorganic insulating layer disposed on the substrate and having a first opening overlapping the bending area, a first organic layer disposed in the first opening, and a plurality of first conductive layers disposed on the first organic layer and extending from the first area to the second area through the bending area, in which at least one edge of the first organic layer overlapping the first conductive layers includes at least one first short circuit prevention pattern.

The first conductive layers may be spaced apart from each other in the first direction, and the at least one first short circuit prevention pattern may be disposed between adjacent first conductive layers.

The at least one first short circuit prevention pattern may be patterned along a first edge of the first organic layer extending in the first direction.

The at least one first short circuit prevention pattern may include a recessed portion formed at the first edge of the first organic layer.

A first edge area of the first inorganic insulating layer may contact the first opening and at least partially overlaps the first edge area of the first organic layer, and the at least one first short circuit prevention pattern may be disposed in the overlapping area.

The at least one first short circuit prevention pattern may include a protrusion protruding from the first edge of the first organic layer.

A first edge area of the first inorganic insulating layer may contact the first opening and overlaps the first edge area of the first organic layer, and the at least one first short circuit prevention pattern may protrude from the first edge of the first organic layer in an opposite direction to the first opening.

The at least one first short circuit prevention pattern may have at least one of a polygonal pattern, a circular pattern, an elliptic pattern, a zigzag pattern, a wavy pattern, a lattice pattern, and a serrate pattern.

The display device may further include a second organic layer disposed on the first conductive layers, a plurality of second conductive layers disposed on the second organic layer and spaced apart from each other in the first direction, in which a second edge of the second organic layer includes at least one second short circuit prevention pattern.

The at least one first short circuit prevention pattern and the at least one second short circuit prevention pattern may each include a recessed portion formed at the first edge of the first organic layer and the second edge of the second organic layer, respectively.

A first edge area of the first inorganic insulating layer may contact the first opening and at least partially overlaps the first edge area of the first organic layer, the second edge of the second organic layer may extend outside the first edge of the first organic layer, and the at least one first short circuit prevention pattern and the at least one second short circuit prevention pattern may be spaced apart from each other in a second direction perpendicular to the first direction.

The at least one first short circuit prevention pattern and the at least one second short circuit prevention pattern may each include a protrusion protruding from the first edge of the first organic layer and from the second edge of the second organic layer, respectively.

A first edge area of the first inorganic insulating layer may contact the first opening and at least partially overlaps the first edge area of the first organic layer, the second edge of the second organic layer may extend outside the first edge of the first organic layer, and the at least one first short circuit prevention pattern and the at least one second short circuit prevention pattern may protrude in an opposite direction to the first opening and spaced apart from each other in a second direction perpendicular to the first direction.

Each of the at least one first short circuit prevention pattern and the at least one second short circuit prevention pattern may include at least one of a polygonal pattern, a circular pattern, an elliptic pattern, a zigzag pattern, a wavy pattern, a lattice pattern, and a serrate pattern.

The first conductive layers and the second conductive layers may overlap each other in a plan view.

The first conductive layers and the second conductive layers may be alternately arranged in the first direction.

The display device may further include a thin-film transistor disposed in at least one of the first area and the second area and including a source electrode, a drain electrode, and a gate electrode, and a thin film encapsulation layer disposed in the first area, in which at least one of the first conductive layers and the second conductive layers are disposed in the same layer as at least one of the source electrode, the drain electrode, and the gate electrode.

At least one of the first conductive layers and the second conductive layers may include a wiring line connected to a display element.

A width of the first organic layer may be greater than a width of the first opening in a second direction perpendicular to the first direction.

The first organic layer may cover the first opening.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
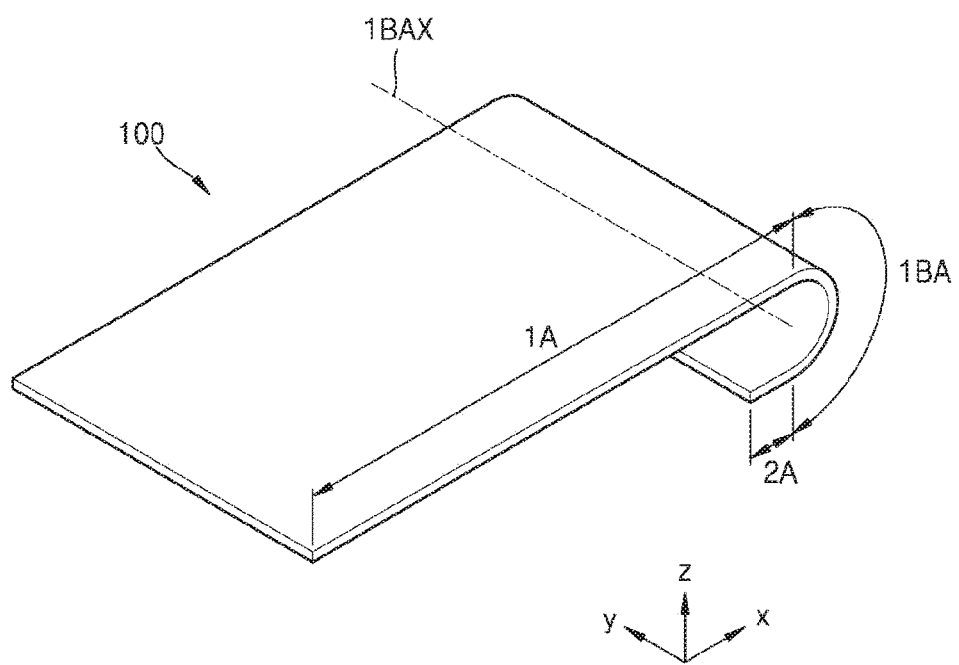
FIG. 1 is a perspective view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
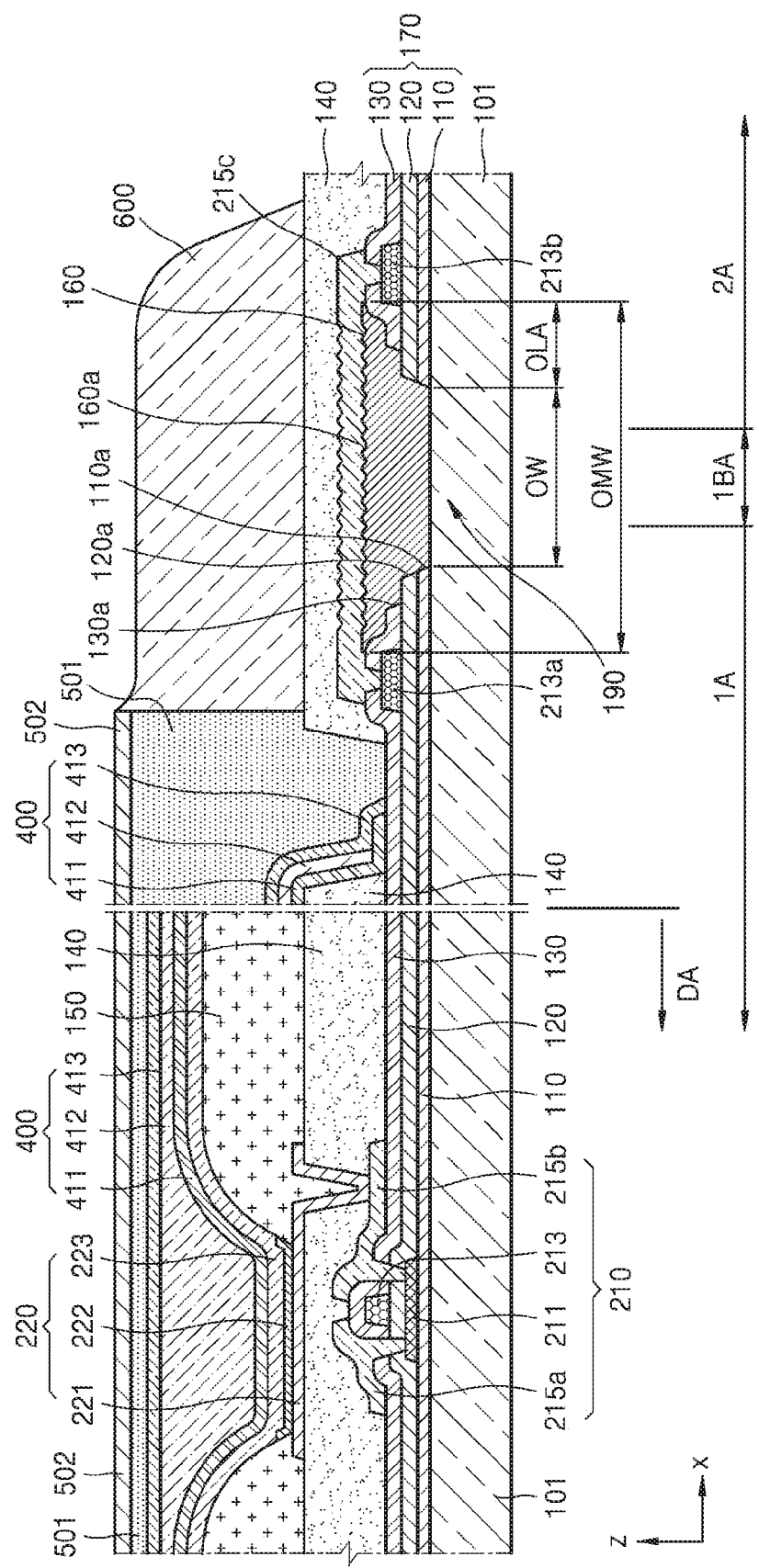
FIG. 2 is a cross-sectional view of a part of the display device of FIG. 1.

FIG. 1 is a perspective view of a display device 100 according to an exemplary embodiment, and FIG. 2 is a cross-sectional view of a part of the display device 100 of FIG. 1.

Referring to FIGS. 1 and 2, the display device 100 includes a substrate 101. The substrate 101 includes a first bending area 1BA extending in a first direction (y direction). The first bending area 1BA may be disposed between a first area 1A and a second area 2A in a second direction (x direction) perpendicular to the first direction (y direction). The substrate 101 may be bent around a first bending axis 1BAX extending in the first direction (y direction).

The substrate 101 may include various materials having flexible or bendable properties. For example, the substrate 101 may include polymer resin, such as polyethersulphone (PES), polyacrylate, (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

The first area 1A includes a display area DA. In an exemplary embodiment, the first area 1A may include a portion of a non-display area in addition to the display area DA. The second area 2A may also include a display area and/or a non-display area, according to an exemplary embodiment.

A thin-film transistor 210 may be disposed in the display area DA. The thin-film transistor 210 may be electrically connected to an organic light-emitting device 220, which may be a display element. It may be understood that an electrical connection from the organic light-emitting device 220 to the thin-film transistor 210 may mean an electrical connection from a pixel electrode 221 to the thin-film transistor 210.

In an exemplary embodiment, a thin-film transistor (not shown) may also be disposed in a surrounding area outside the display area DA of the substrate 101. The thin-film transistor disposed in the surrounding area may be a portion of a circuit unit for controlling an electrical signal that is applied to the display area DA.

The thin-film transistor 210 includes a semiconductor layer 211, a gate electrode 213, a source electrode 215a, and a drain electrode 215b. The semiconductor layer 211 may include amorphous silicon, polysilicon, or organic semiconductor material. A gate insulating layer 120 may be disposed between the semiconductor layer 211 and the gate electrode 213 and insulate the semiconductor layer 211 and the gate electrode 213. The gate insulating layer 120 may include an inorganic material, such as silicon oxide, silicon nitride, and/or silicon oxynitride.

An interlayer insulating layer 130 may be disposed on the gate electrode 213. The interlayer insulating layer 130 may include an inorganic material, such as silicon oxide, silicon nitride, and/or silicon oxynitride. The source electrode 215a and the drain electrode 215b may be disposed on the interlayer insulating layer 130. The gate insulating layer 120 and the interlayer insulating layer 130, which may include the inorganic material, may be formed through a chemical vapor deposition (CVD) process or an atomic layer deposition (ALD) process.

A buffer layer 110 may include an inorganic material, such as silicon oxide, silicon nitride, and/or silicon oxynitride, and be disposed between the substrate 101 and the thin-film transistor 210. The buffer layer 110 may increase the smoothness of the upper surface of the substrate 101 and/or may prevent impurities from permeating into the semiconductor layer 211 from the substrate 101.

A planarization layer 140 may be disposed on the thin-film transistor 210. For example, when the organic light-emitting device 220 is disposed on the thin-film transistor 210, the planarization layer 140 may planarize an upper portion of the thin-film transistor 210. The planarization layer 140 may include an organic material, such as acryl, benzocyclobutene (BCB), or hexamethyldisiloxane (HMDSO).

Although the planarization layer 140 is illustrated as a single layer, the planarization layer 140 may be variously modified. For example, the planarization layer 140 may include multiple layers. In an exemplary embodiment, the planarization layer 140 may have an opening outside the display area DA, and thus, a portion of the planarization layer 140 in the display area DA may be physically separated from a portion of the planarization layer 140 in the second area 2A. In this manner, impurities may be prevented from permeating from the outside to the inside of the display area DA through the planarization layer 140.

In the display area DA, the organic light-emitting device 220 may be disposed on the planarization layer 140. The organic light-emitting device 220 may include the pixel electrode 221, an opposite electrode 223, and an intermediate layer 222 including an emission layer disposed therebetween. The pixel electrode 221 may contact at least one of the source electrode 215a and the drain electrode 215b through a contact hole formed in the planarization layer 140.

A pixel defining layer 150 may be disposed on the planarization layer 140. The pixel defining layer 150 may define a pixel by having an opening corresponding to each subpixel. More particularly, an opening of the pixel defining layer 150 may expose at least a central portion of the pixel electrode 221. The pixel defining layer 150 may prevent occurrence of an arc at the edge of the pixel electrode 221, by increasing an interval between the edge of the pixel electrode 221 and the opposite electrode 223. The pixel defining layer 150 may include an organic material, such as polyimide or hexamethyldisiloxane (HMDSO).

In an exemplary embodiment, a stack structure of organic material layers, such as the planarization layer 140 and the pixel defining layer 150, may not limited to any one structure. For example, the planarization layer 140 may have a double layer structure, or another organic material layer may be disposed between the planarization layer 140 and the pixel defining layer 150.

The intermediate layer 222 may include a low molecular material or a polymer material. When the intermediate layer 222 includes the low molecular material, the intermediate layer 222 may have a structure, in which at least one of a hole injection layer (HIL), a hole transport layer (HTL), an emission layer (EML), an electron transport layer (ETL), and an electron injection layer (EIL) are stacked. In this case, the intermediate layer 222 may include various organic materials, such as copper phthalocyanine (CuPc), N,N'-Di (naphthalene-1-yl)-N,N'-diphenyl-benzidine (NPB), and tris-8-hydroxyquinoline aluminum (Alq3). The HIL, the HTL, the EML, the ETL, and the EIL may be formed by using a vacuum deposition method.

When the intermediate layer 222 includes the polymer material, the intermediate layer 222 may have a structure including an HTL and an EML. In this case, the HTL may include PEDOT, and the EML may include a polymer material, such as a poly-phenylenevinylene (PPV)-based polymer material or a polyfluorene-based polymer material. The HTL and the EML may be formed by using screen printing, inkjet printing, or laser induced thermal imaging (LITI).

The intermediate layer 222, however, is not limited to the above and may have various structures. The intermediate layer 222 may have an integral layer over pixel electrodes 221, and may include a layer patterned to correspond to each of the pixel electrodes 221.

The opposite electrode 223 may be disposed on the display area DA and cover the display area DA. The opposite electrode 223 may integrally extend over organic light-emitting devices 220 and correspond to the pixel electrodes 221.

Since the organic light-emitting device 220 may be easily damaged by moisture or oxygen from the outside, a thin film encapsulation (TFE) layer 400 may be disposed on the organic light-emitting device 220. The TFE layer 400 may extend up to the outside of the display area DA. The TFE layer 400 may include a first inorganic encapsulation layer 411, an organic encapsulation layer 412, and a second inorganic encapsulation layer 413.

The first inorganic encapsulation layer 411 may cover the opposite electrode 223. The first inorganic encapsulation layer 411 may include silicon oxide, silicon nitride, and/or silicon oxynitride. In an exemplary embodiment, other layers, such as a capping layer, may disposed between the first inorganic encapsulation layer 411 and the opposite electrode 223. Since the first inorganic encapsulation layer 411 is formed along a structure thereunder, the upper surface of the first inorganic encapsulation layer 411 may not be flat.

The organic encapsulation layer 412 may cover the first inorganic encapsulation layer 411. The upper surface of the organic encapsulation layer 412 may be flat. The organic encapsulation layer 412 may include at least one of polyethylene terephthalate, polyethylene naphthalate, polycarbonate, polyimide, polyethylene sulfonate, polyoxymethylene, polyarylate, and hexamethyldisiloxane.

The second inorganic encapsulation layer 413 may cover the organic encapsulation layer 412. The second inorganic encapsulation layer 413 may include silicon oxide, silicon nitride, and/or silicon oxynitride. The second inorganic encapsulation layer 413 may contact the first inorganic encapsulation layer 411 at an edge outside the display area DA, such that the organic encapsulation layer 412 is not exposed to the outside.

An anti-reflection layer 502 may be disposed above the TFE layer 400 with an optically clear adhesive (OCA) 501 disposed therebetween. In an exemplary embodiment, the anti-reflection layer 502 may be a polarizing layer. The anti-reflection layer 502 may reduce the reflection of external light. The OCA 501 and the anti-reflection layer 502 may cover the opening of the planarization layer 140. In an exemplary embodiment, the anti-reflection layer 502 may be omitted and be replaced with other elements. For example, the reflection of external light may be reduced by using a black matrix and a color filter.

A structure including the buffer layer 110, the gate insulating layer 120, and the interlayer insulating layer 130, each of which may include an inorganic material, may be referred to as a first inorganic insulating layer 170. The first inorganic insulating layer 170 may have a first opening 190 corresponding to the first bending area 1BA. In detail, the buffer layer 110, the gate insulating layer 120, and the interlayer insulating layer 130 may respectively have openings 110a, 120a, and 130a corresponding to the first bending area 1BA. As used herein, the first opening 190 corresponding to the first bending area 1BA may mean that the first opening 190 overlaps the first bending area 1BA.

The area of the first opening 190 may be greater than that of the first bending area 1BA. In FIG. 2, a width OW of the first opening 190 may be greater than that of the first bending area 1BA. The area of the first opening 190 may be defined as the area of the narrowest opening among the opening 110a of the buffer layer 110, the opening 120a of the gate insulating layer 120, and the opening 130a of the interlayer insulating layer 130. As such, the area of the first opening 190 may be defined by the area of the opening 110a of the buffer layer 110.

At least a portion of the first opening 190 may be filled with a first organic layer 160. In an exemplary embodiment, the first organic layer 160 may cover the first opening 190. In an exemplary embodiment, the first organic layer 160 may be formed by a different process from that forming the planarization layer 140 and the pixel defining layer 150, which are organic layers disposed in the display area DA. In an exemplary embodiment, the first organic layer 160 may alternatively be formed by the same process as that forming at least one of the planarization layer 140 and the pixel defining layer 150.

An uneven surface 160a may be formed in a third direction (z direction) perpendicular to the substrate 101, and on the upper surface of a portion of the first organic layer 160, which corresponds to the first opening 190. A width OMW of the first organic layer 160 may be greater than the width OW of the first opening 190 in the second direction (x direction). In an exemplary embodiment, the upper surface of the first organic layer 160 may alternatively have a flat surface.

A plurality of first conductive layers 215c may be disposed on the first organic layer 160. Since the first organic layer 160 includes the uneven surface 160a, the upper surface and/or the lower surface of each of the first conductive layers 215c disposed on the first organic layer 160 may have a shape corresponding to the uneven surface 160a of the first organic layer 160. In an exemplary embodiment, the upper surface and/or the lower surface of each of the first conductive layers 215c may alternatively have a flat surface.

The first conductive layers 215c may extend from the first area 1A to the second area 2A through the first bending area 1BA. In an area where the first organic layer 160 is not formed, the first conductive layers 215c may be disposed on the first inorganic insulating layer 170 including the interlayer insulating layer 130. The first conductive layers 215c crossing the first bending area 1BA may include a material having high elongation.

In an exemplary embodiment, the first conductive layers 215c may be formed simultaneously with the source electrode 215a or the drain electrode 215b by using the same material as the source electrode 215a or the drain electrode 215b. In an exemplary embodiment, each of the first conductive layers 215c may be formed as a single layer or multiple layers including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In an exemplary embodiment, each of the first conductive layers 215c may alternatively have a stack structure of titanium (Ti)/aluminum (Al)/titanium (Ti).

In the first bending area 1BA, the display device 100 may be bent along the first bending axis 1BAX. The first inorganic insulating layer 170 may have the first opening 190 in the first bending area 1BA. The first opening 190 may be filled with the first organic layer 160, and the first conductive layers 215c may be disposed on the first organic layer 160. Since the first inorganic insulating layer 170 having a hardness greater than an organic material is not formed in the first opening 190 corresponding to the first bending area 1BA, a crack that would otherwise be formed in the first inorganic insulating layer 170 from bending the substrate 101 may not be formed or be prevented.

The display device 100 according an exemplary embodiment may further include conductive parts 213a and 213b. The conductive parts 213a and 213b may be disposed in the first area 1A or in the second area 2A, and disposed in a layer different from a layer on which the first conductive layers 215c are disposed. The conductive parts 213a and 213b may be electrically connected to the first conductive layers 215c. The conductive parts 213a and 213b may be disposed in the same layer as the gate electrode 213, and include the same material as the gate electrode 213. The first conductive layers 215c may contact the conductive parts 213a and 213b through a contact hole formed in the interlayer insulating layer 130.

The first conductive part 213a may be disposed in the first area 1A, and the second conductive part 213b may be disposed in the second area 2A. The first conductive part 213a disposed in the first area 1A may be electrically connected to the thin-film transistor 210 in the display area DA. Accordingly, each of the first conductive layers 215c may be electrically connected to the thin-film transistor 210 in the display area DA via the first conductive part 213a and serve as wiring.

The second conductive part 213b disposed in the second area 2A may also be electrically connected to the thin-film transistor 210 in the display area DA by the first conductive layers 215c. In this manner, the conductive parts 213a and 213b may be electrically connected to elements disposed in the display area DA while being disposed outside the display area DA.

In an exemplary embodiment, the conductive parts 213a and 213b may extend in a direction towards the display area DA while being disposed outside the display area DA. As such, at least a portion of at least one of the conductive parts 213a and 213b may be disposed in the display area DA. In an exemplary embodiment, the first conductive layers 215c may not be connected to the conductive parts 213a and 213b, and may alternatively be directly electrically connected to the thin-film transistor 210 in the display area DA and serve as wiring.

A stress neutralization layer (SNL) 600 may be disposed outside the display area DA. The SNL 600 may be disposed on the first conductive layers 215c and correspond to at least the first bending area 1BA. As a stress neutral plane is disposed around the first conductive layers 215c through the SNL 600, tensile stress applied to the first conductive layers 215c may be reduced. In an exemplary embodiment, the SNL 600 may extend up to the edge of the substrate 101 and protect electrically connected elements.

In an exemplary embodiment, a plurality of first conductive layers 215c may be disposed to be spaced apart from each other in the first direction (y direction). As described above, the first conductive layers 215c may be formed simultaneously with the source electrode 215a or the drain electrode 215b by using the same material as the source electrode 215a or the drain electrode 215b. To this end, conductive layers may be formed on the overall surface of the substrate 101, and then be patterned to form the source electrode 215a, the drain electrode 215b, and the first conductive layers 215c. In this case, a portion of a conductive material forming the first conductive layers 215c disposed on the first organic layer 160 may not be completely removed in the process of patterning the first conductive layers 215c. As such, a portion of the conductive material may remain along an edge of the first organic layer 160 between adjacent conductive layers 215c, which may cause a short circuit between the adjacent conductive layers 215c.

In an exemplary embodiment, at least one short circuit prevention pattern for preventing a short circuit between adjacent first conductive layers 215c may be disposed at an edge of the first organic layer 160.

Figure 3:
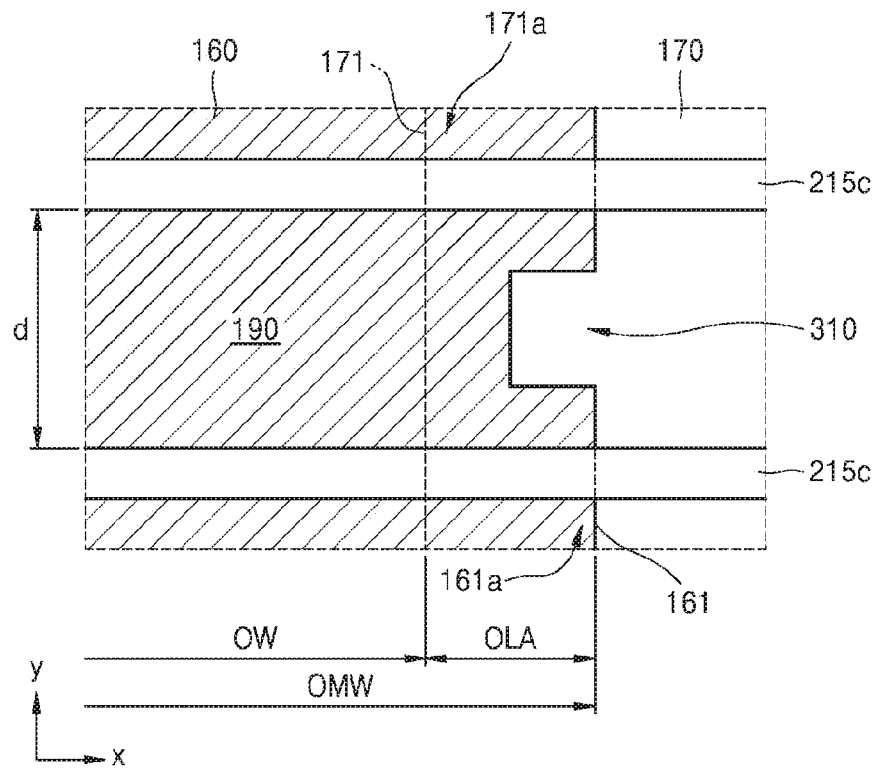
FIG. 3 is a magnified plan view of an area of FIG. 2 in which conductive layers and an organic layer extend from a bending area to a second area.

FIG. 3 is a magnified plan view of an area of FIG. 2, where the first conductive layers 215c and the first organic layer 160 extend from the first bending area 1BA to the second area 2A.

Referring to FIG. 3, the first opening 190 may be an area from which the first inorganic insulating layer 170 corresponding to the first bending area 1BA has been removed. The first organic layer 160 may cover the first opening 190. The width OMW of the first organic layer 160 may be greater than the width OW of the first opening 190 in the second direction (x direction). A first edge area 161a of the first organic layer 160 and a first edge area 171a of the first inorganic insulating layer 170 may at least partially overlap each other. An area OLA, in which the first edge area 161a of the first organic layer 160 and the first edge area 171a of the first inorganic insulating layer 170 overlap each other, may be disposed between ends of the width OMW of the first organic layer 160 and the width OW of the first opening 190.

A plurality of first conductive layers 215c may be disposed to be spaced apart from each another in the first direction (y direction). Each of the first conductive layers 215c may cross the first organic layer 160 in the second direction (x direction). A first short circuit prevention pattern 310 may be disposed at the first edge 161 of the first organic layer 160 overlapping the first conductive layers 215c. In detail, the first short circuit prevention pattern 310 may be disposed at the first edge 161 of the first organic layer 160 corresponding to an interval d between adjacent first conductive layers 215c. The first short circuit prevention pattern 310 may be patterned along the first edge 161 of the first organic layer 160 extending in the first direction (y direction) of the substrate 101 of FIG. 2.

In an exemplary embodiment, the first short circuit prevention pattern 310 may be patterned at both edges of the first organic layer 160 in the second direction (x direction). The first short circuit prevention pattern 310 may be disposed at each edge of the first organic layer 160 overlapping the first conductive layers 215c.

The first short circuit prevention pattern 310 may have a recessed portion, of which may be formed by removing at least a portion of the first organic layer 160 from the first edge 161 of the first organic layer 160. In FIG. 3, the first short circuit prevention pattern 310 may be a recessed portion having a tetragonal shape. However, the first short circuit prevention pattern 310 may have various patterns. For example, the first short circuit prevention pattern 310 may have a polygonal pattern, such as a triangle or a trapezoid, a circular pattern, an elliptic pattern, a zigzag pattern, a wavy pattern, a lattice pattern, and a serrate pattern. If the first short circuit prevention pattern 310 has a recessed portion formed by removing a portion of the first organic layer 160, the shape of the first short circuit prevention pattern 310 may not be limited to the above.

Figure 10:
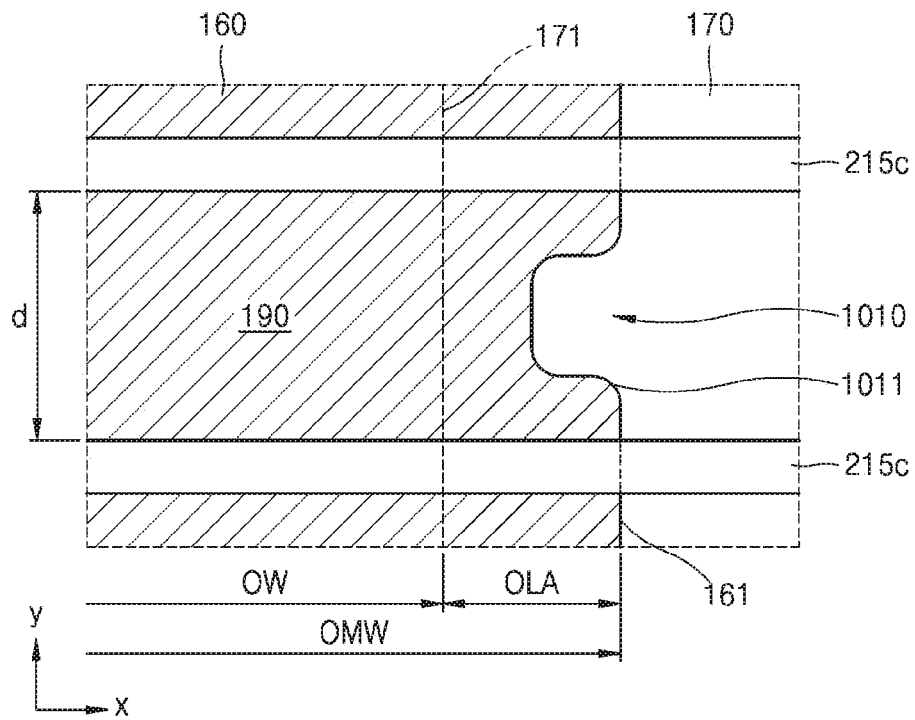
FIG. 10 is a view illustrating an area of FIG. 3 according to an exemplary embodiment

In an exemplary embodiment, a corner of the first short circuit prevention pattern 310 may have a curved shape. For example, referring to FIG. 10, a curvature portion 1011 may be formed at each corner of a first short circuit prevention pattern 1010.

Referring back to FIG. 3, the first short circuit prevention pattern 310 may be disposed in the area OLA, on which the first organic layer 160 and the first inorganic insulating layer 170 overlap each other. In detail, the first short circuit prevention pattern 310 may be disposed in the area OLA, on which the first edge area 161a of the first organic layer 160 filling the first opening 190 overlaps the first edge area 171a of the first inorganic insulating layer 170 contacting the first opening 190.

Since the first short circuit prevention pattern 310 is formed at the first edge 161 of the first organic layer 160, the path of the first edge 161 of the first organic layer 160 disposed between adjacent first conductive layers 215c, which are spaced apart by an interval of d, may be increased. As the path of the first edge 161 of the first organic layer 160 is increased, the probability of causing short circuit between adjacent first conductive layers 215, of which may be caused by a conductive material remaining along the first edge 161 of the first organic layer 160 when the first conductive layers 215c are patterned, may be reduced.

Figure 4:
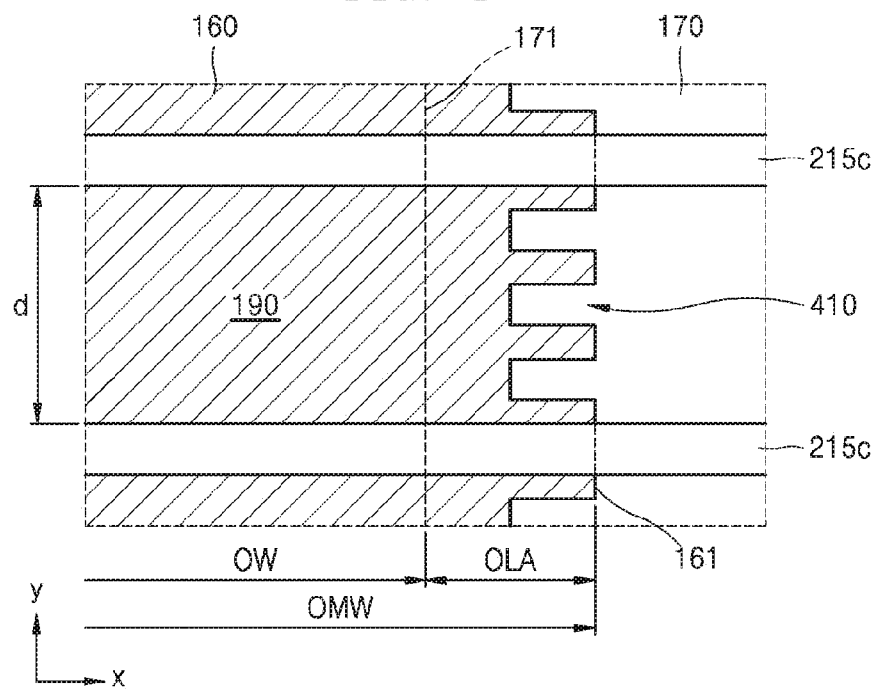
FIG. 4, FIG. 5, and FIG. 6 are views respectively illustrating an area of FIG. 3 according to exemplary embodiments.

In FIG. 3, although one first short circuit prevention pattern 310 is shown to be disposed between two adjacent first conductive layers 215c, the inventive concept is not limited thereto. For example, as shown in FIG. 4, a plurality of first short circuit prevention patterns 310 may be disposed to be spaced apart from each other in a space corresponding to the interval d between adjacent first conductive layers 215c. If the path of the first edge 161 of the first organic layer 160 may be increased, the number of the first short circuit prevention patterns 310 may not be limited.

Figure 5:
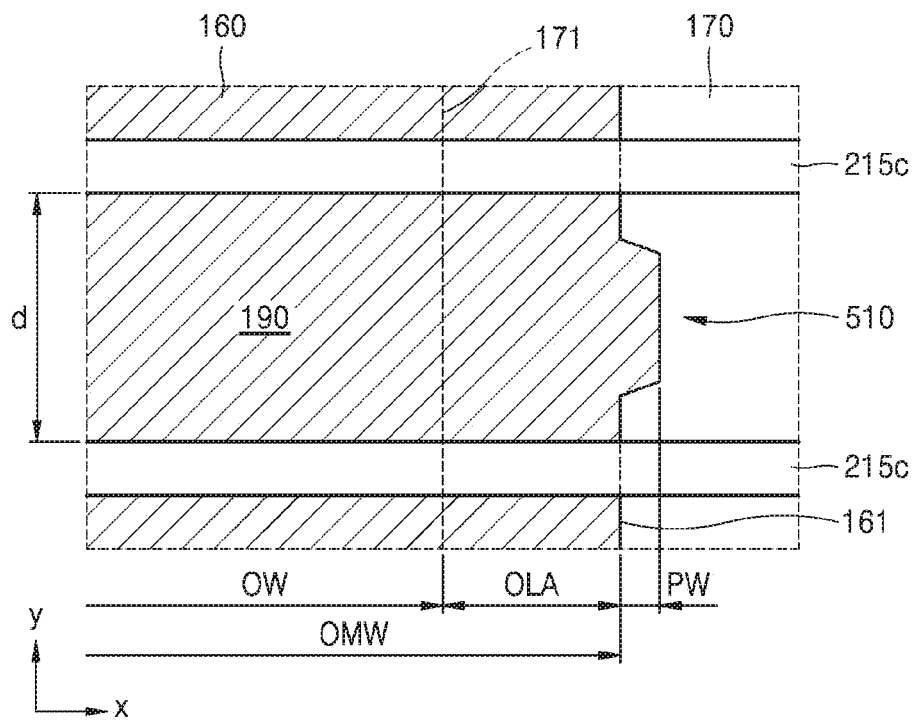

FIG. 5 a magnified plan view of an area of FIG. 2, according to an exemplary embodiment.

Referring to FIG. 5, a first opening 190 may be an area from which a first inorganic insulating layer 170 corresponding to the first bending area 1BA of FIG. 2 has been removed. A first organic layer 160 may cover the first opening 190. The width OMW of the first organic layer 160 may be greater than the width OW of the first opening 190 in a second direction (x direction).

An overlapping area OLA may be disposed between a first edge 161 of the first organic layer 160 and a first edge 171 of the first inorganic insulating layer 170.

A plurality of first conductive layers 215c may be disposed to be spaced apart from each another in a first direction (y direction). Each of the first conductive layers 215c may cross the first organic layer 160 in the second direction (x direction). A first short circuit prevention pattern 510 may be disposed at the first edge 161 of the first organic layer 160 overlapping the first conductive layers 215c. In detail, the first short circuit prevention pattern 510 may be disposed at the first edge 161 of the first organic layer 160 corresponding to an interval d between adjacent first conductive layers 215c. The first short circuit prevention pattern 510 may be patterned along the first edge 161 of the first organic layer 160 extending in the first direction (y direction) of the substrate 101 of FIG. 2. In an exemplary embodiment, the first short circuit prevention pattern 510 may be patterned at both edges of the first organic layer 160 in the second direction (x direction).

The first short circuit prevention pattern 510 may have a protrusion, in which at least a portion of the first organic layer 160 protrudes from the first edge 161 of the first organic layer 160. In FIG. 5, the protrusion of the first short circuit prevention pattern 510 may have a trapezoidal shape. However, if the first short circuit prevention pattern 510 has the protrusion that protrudes from the first edge 161 of the first organic layer 160, the shape of the first short circuit prevention pattern 310 may not be limited.

Figure 11:
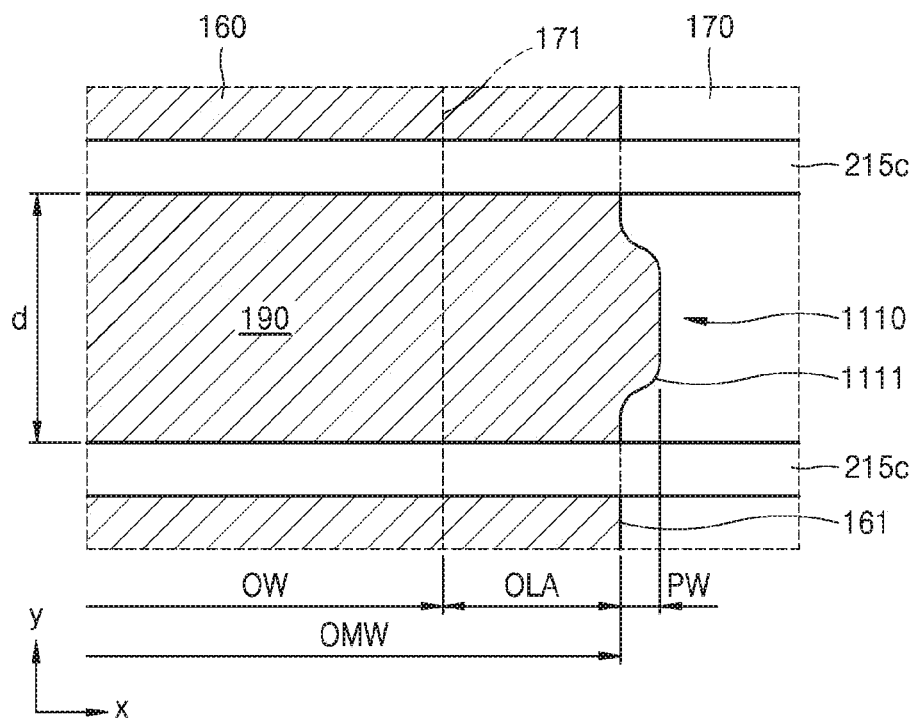
FIG. 11 is a view illustrating an area of FIG. 5 according to an exemplary embodiment.

In an exemplary embodiment, a corner of the first short circuit prevention pattern 510 may have a curved shape. For example, referring to FIG. 11, a curvature portion 1111 may be formed at each corner of a first short circuit prevention pattern 1110.

Referring back to FIG. 5, the first short circuit prevention pattern 510 may protrude from the first edge 161 of the first organic layer 160 in the opposite direction to the first opening 190. If a protrusion width PW of the first short circuit prevention pattern 510 may increase the path of the first edge 161 of the first organic layer 160, the configuration of the first short circuit prevention pattern 510 is not limited thereto.

Figure 6:
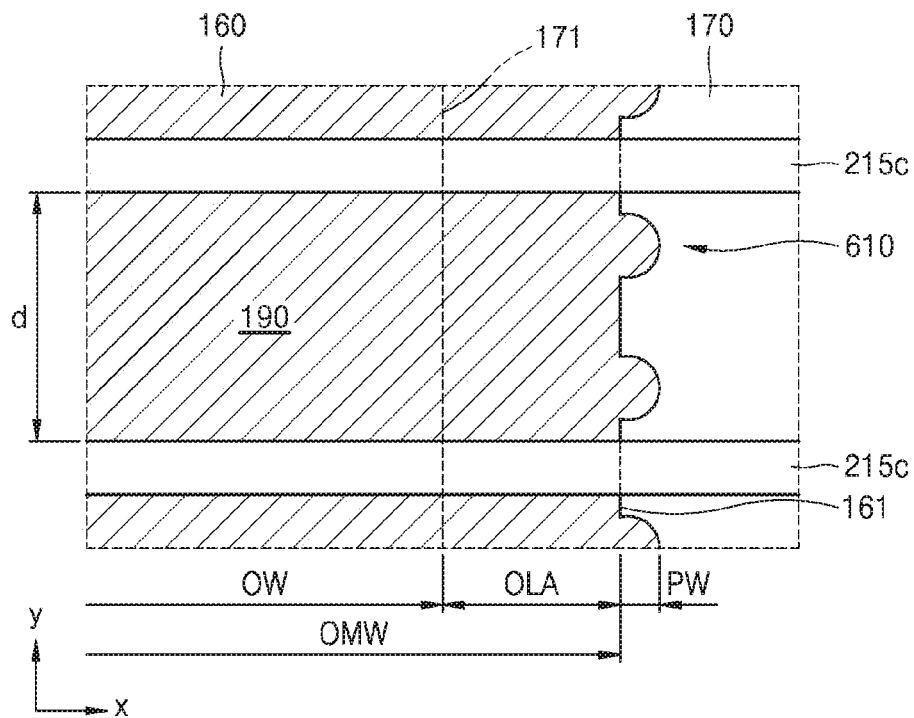

In FIG. 5, although one first short circuit prevention pattern 510 is shown to be disposed between two adjacent first conductive layers 215c, the inventive concept is not limited thereto. For example, as shown in FIG. 6, a plurality of first short circuit prevention patterns 610 may be disposed in a space corresponding to an interval d between adjacent first conductive layers 215c. The protrusions of first short circuit prevention pattern 610 may each have a circular pattern between adjacent first conductive layers 215c. A plurality of first short circuit prevention patterns 610 may be arranged in a space corresponding to an interval d between adjacent first conductive layers 215c.

In this manner, the first short circuit prevention patterns 310, 410, 510, 610, 1010, and 1110 may extend in the first direction (y direction) of the substrate 101 and be patterned in various forms to increase a short circuit path along at least an edge 161 of the first organic layer 160 overlapping the first conductive layers 215c.

Figure 7:
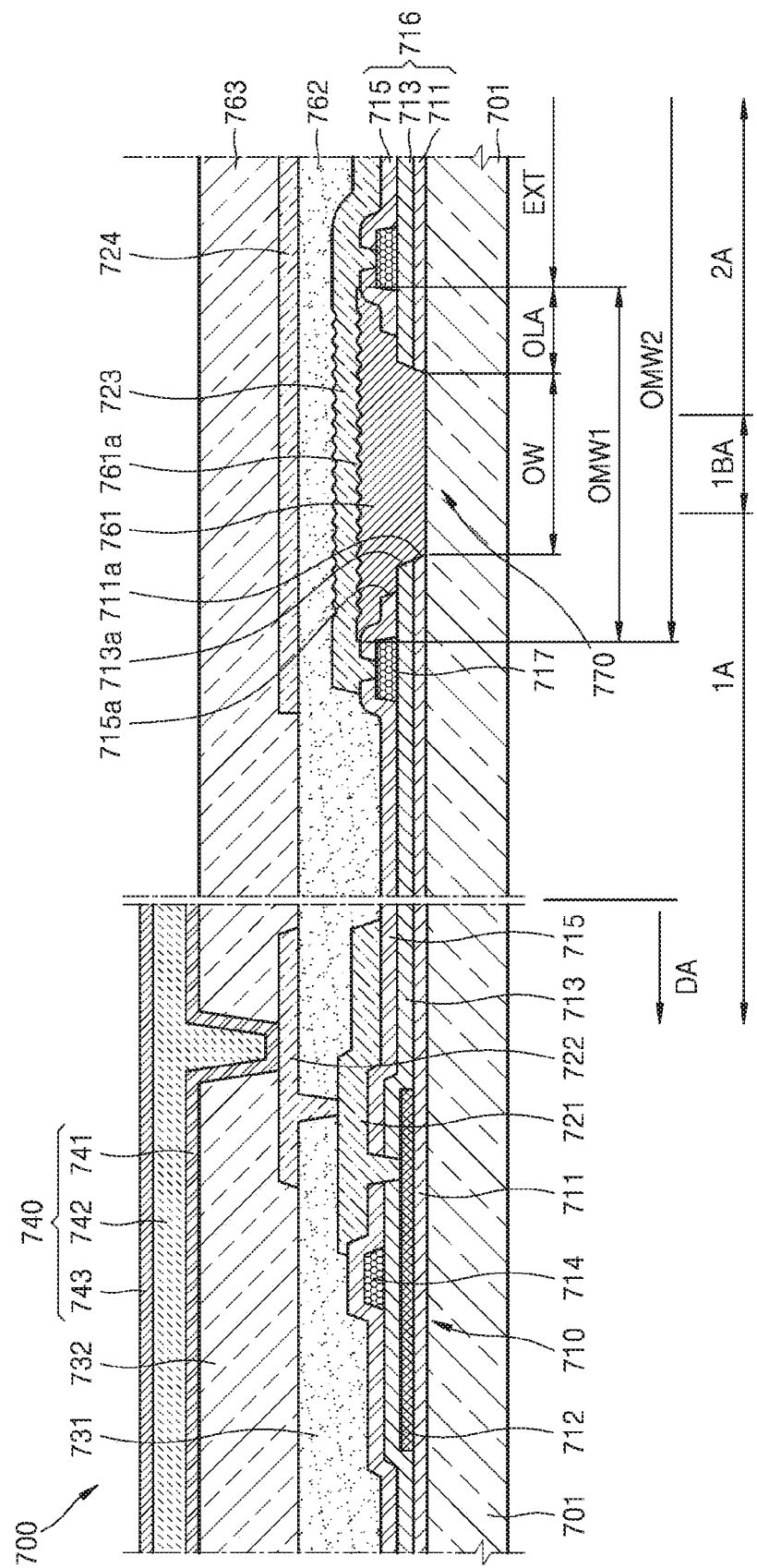
FIG. 7 is a cross-sectional view of a part of a display device according to an exemplary embodiment.
Figure 8:
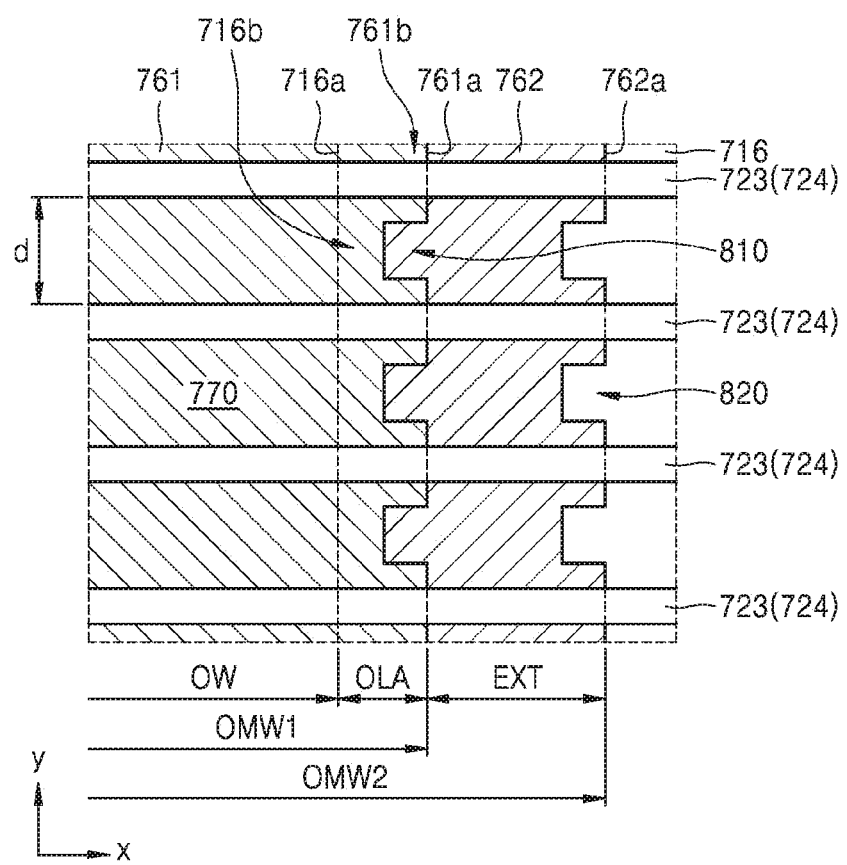
FIG. 8 is a magnified plan view of an area of FIG. 7 in which conductive layers and organic layers extend from a bending area to a second area.

FIG. 7 is a cross-sectional view of a part of a display device 700, according to an exemplary embodiment, and FIG. 8 is a magnified plan view of an area of FIG. 7, in which conductive layers 723 and 724 and organic layers 761 and 762 extend from a bending area 1BA to a second area 2A.

Referring to FIGS. 7 and 8, the display device 700 includes a substrate 701. The substrate 701 includes a first bending area 1BA extending in a first direction (y direction). The first bending area 1BA may be disposed between a first area 1A and a second area 2A in a second direction (x direction).

A buffer layer 711 may be disposed on the substrate 701. The buffer layer 711 may cover the entire upper surface of the substrate 701. The buffer layer 711 may include an inorganic material or an organic material. The buffer layer 711 may be formed as a single layer or multiple layers.

A thin-film transistor 710 may be disposed on the buffer layer 711. The thin-film transistor 710 includes a semiconductor layer 712. A gate electrode 714 may be disposed on the semiconductor layer 712. The gate electrode 714 may be formed as a single layer or multiple layers including Au, Ag, Cu, Ni, Pt, Pd, Al, Mo, and/or Cr. The gate electrode 714 may include an alloy, such as Al:Nd or Mo:W.

A gate insulating layer 713 insulting the semiconductor layer 712 from the gate electrode 714 may be disposed between the semiconductor layer 712 and the gate electrode 714. The gate insulating layer 713 may be an inorganic layer. An interlayer insulating layer 715 may be disposed on the gate electrode 714. The interlayer insulating layer 715 may include an inorganic layer or an organic layer.

A first conductive part 721 may be disposed on the thin-film transistor 710. The first conductive part 721 may form a source electrode, a drain electrode, or a data line. The first conductive part 721 may be connected to the semiconductor layer 712 via a contact hole formed in the gate insulating layer 713 and the interlayer insulating layer 715.

The first conductive part 721 may be formed as a single layer or multiple layers including at least one of Al, Pt, Pd, Ag, Mg, Au, Ni, Nd, Ir, Cr, Li, Ca, Mo, Ti, W, and Cu. In an exemplary embodiment, the first conductive part 721 may alternatively have a stack structure of titanium (Ti)/aluminum (Al)/titanium (Ti).

A first organic insulating layer 731 may be disposed on the first conductive part 721. The first organic insulating layer 731 may cover the first conductive part 721. An inorganic insulating layer (not shown) may be further formed between the first conductive part 721 and the first organic insulating layer 731 to prevent oxidation of the first conductive part 721.

A second conductive part 722 may be disposed on the first conductive part 721. The second conductive part 722 may be connected to the first conductive part 721 via a contact hole formed in the first organic insulating layer 731. The second conductive part 722 may reduce the occurrence of parasitic capacitance between the gate electrode 714 and the pixel electrode 741. The second conductive part 722 may include substantially the same material as the first conductive part 721.

A second organic insulating layer 732 may be disposed on the second conductive part 722. The second organic insulating layer 732 may cover the second conductive part 722. An inorganic insulating layer (not shown) may be further formed between the second conductive part 722 and the second organic insulating layer 732.

An organic light-emitting device 740 may be disposed on the second organic insulating layer 732. The organic light-emitting device 740 includes a pixel electrode 741, an intermediate layer 742 including an organic emission layer, and an opposite electrode 743. The pixel electrode 741 may be connected to the second conductive part 722 via a contact hole formed in the second organic insulating layer 732. The first conductive part 721 and the second conductive part 722 may be intermediate connection layers for connecting the semiconductor layer 712 and the pixel electrode 741. In this manner, the organic light-emitting device 740 may be electrically connected to the thin-film transistor 710 by the first conductive part 721 and the second conductive part 722.

A structure including the buffer layer 711, the gate insulating layer 713, and the interlayer insulating layer 715, each of which may include inorganic material, may be referred to as a first inorganic insulating layer 716. The first inorganic insulating layer 716 may have a first opening 770 corresponding to the first bending area 1BA. In detail, the buffer layer 711, the gate insulating layer 713, and the interlayer insulating layer 715 may respectively have openings 711a, 713a, and 715a corresponding to the first bending area 1BA.

The area of the first opening 770 may be greater than that of the first bending area 1BA. A width OW of the first opening 770 may be greater than that of the first bending area 1BA in the second direction (x direction). As used herein, the area of the first opening 770 may be defined by the area of the opening 711a of the buffer layer 711.

The display device 700 includes a first organic layer 761, with which at least a portion of the first opening 770 of the first inorganic insulating layer 716 is filled. The first organic layer 761 may cover the first opening 770. In an exemplary embodiment, the first organic layer 761 may be formed by a different process from that forming the first and second organic insulating layers 731 and 732, which may include organic layers disposed in a display area DA.

An uneven surface may be formed in the upper surface of the first organic layer 761, which corresponds to the first opening 770. In an exemplary embodiment, the uneven surface 760a may be omitted in the first organic layer 761. A width OMW of the first organic layer 761 may be greater than the width OW of the first opening 770 in the second direction (x direction).

First conductive layers 723 may be disposed on the first organic layer 761. The first conductive layers 723 may extend from the first area 1A to the second area 2A through the first bending area 1BA. In an area where the first organic layer 761 is not formed, the first conductive layers 723 may be disposed on the first inorganic insulating layer 716 including the interlayer insulating layer 715.

In an exemplary embodiment, the first conductive layers 723 may include the same material as the first conductive part 721 disposed in the display area DA and be formed simultaneously with the first conductive part 721.

The display device 700 may further include a third conductive part 717. The third conductive part 717 may be disposed in the first area 1A or the second area 2A, and disposed in a layer different from a layer on which the first conductive layers 723 are disposed. The third conductive part 717 may be electrically connected to the first conductive layers 723. The third conductive part 717 may be disposed on the same layer as the gate electrode 714 and include the same material as the gate electrode 714. The first conductive layers 723 may contact the third conductive part 717 through a contact hole formed in the interlayer insulating layer 715. The first conductive layers 723 may be electrically connected to the thin-film transistor 710 in the display area DA via the third conductive part 717 and serve as wirings. In an exemplary embodiment, the first conductive layers 723 may alternatively be directly connected to the thin-film transistor 710 without passing through the third conductive part 717. In other words, various wiring methods may be used to connect the first conductive layers 723 to the thin-film transistor 710.

Unlike the exemplary embodiment of FIG. 2, the display device 700 may further include second conductive layers 724 disposed on the first conductive layers 723. In detail, a second organic layer 762 may be disposed on the first conductive layers 723. The second organic layer 762 may cover the first conductive layers 723. The second organic layer 762 may include the same material as the first organic insulating layer 731 in the display area DA and be formed simultaneously with the first organic insulating layer 731.

Second conductive layers 724 may be disposed on the second organic layer 762. The second conductive layers 724 may extend from the first area 1A to the second area 2A through the first bending area 1BA. In an exemplary embodiment, the second conductive layers 724 may include the same material as the second conductive part 722 disposed in the display area DA and be formed simultaneously with the second conductive part 722. The second conductive layers 724 may be directly electrically connected to the thin-film transistor 710 in the display area DA or contact the third conductive part 717 via a contact hole formed in the interlayer insulating layer 715, and may serve as wiring.

In an exemplary embodiment, the second conductive layers 724 may be electrically connected to the first conductive layers 723 in a non-display area, such as in a pad area. In an exemplary embodiment, at least one insulating layer including an inorganic layer or an organic layer may be interposed between the first conductive layers 723 and the second conductive layers 724 to insulate them from each other.

A third organic layer 763 may be disposed on the second conductive layers 724. The third organic layer 763 may cover the second conductive layers 724. The third organic layer 763 may include the same material as the second organic insulating layer 732 in the display area DA and be formed simultaneously with the second organic insulating layer 732.

In an exemplary embodiment, a plurality of first conductive layers 723 may be disposed to be spaced apart from each other in the first direction (y direction), and a plurality of second conductive layers 724 may be disposed to be spaced apart from each other in the first direction (y direction). In an exemplary embodiment, each of the first conductive layers 723 and each of the second conductive layers 724 may be disposed to overlap each other in plan view, along the first direction (y direction) of the substrate 701.

In an exemplary embodiment, a short circuit prevention pattern for preventing a short circuit of the first and second conductive layers 723 and 724 may be disposed on at least one edge of the first organic layer 761, the second organic layer 762, and the third organic layer 763.

Referring to FIG. 8, the first opening 770 may be an area from which the first inorganic insulating layer 716 corresponding to the first bending area 1BA of FIG. 7 has been removed. The first organic layer 761 may cover the first opening 770. A first width OMW1 of the first organic layer 761 may be greater than a width OW of the first opening 770 in the second direction (x direction). A first edge area 761*b* of the first organic layer 761 filling the first opening 770 and a first edge area 716*b* of the first inorganic insulating layer 716 contacting the first opening 770 may at least partially overlap each other. An area OLA, in which the first edge area 761*b* of the first organic layer 761 and the first edge area 716*b* of the first inorganic insulating layer 716 overlap each other, may be disposed between ends of the first width OMW1 of the first organic layer 761 and the width OW of the first opening 770.

A plurality of first conductive layers 723 may be disposed to be spaced apart from each another in the first direction (y direction). Each of the first conductive layers 723 may cross the first organic layer 761. A first short circuit prevention pattern 810 may be disposed at the first edge 761*a* of the first organic layer 761 overlapping the first conductive layer 723. In detail, the first short circuit prevention pattern 810 may be disposed at the first edge 761*a* of the first organic layer 761 corresponding to an interval d between adjacent first conductive layers 723. The first short circuit prevention pattern 810 may be patterned along the first edge 761*a* of the first organic layer 761 extending in the first direction (y direction) of the substrate 701 of FIG. 7.

The first short circuit prevention pattern 810 may have a recessed portion, of which may be formed by removing at least a portion of the first organic layer 761 from the first edge 761*a* of the first organic layer 761. In FIG. 8, the first short circuit prevention pattern 810 may include a recessed portion having a tetragonal shape.

The first short circuit prevention pattern 810 may be disposed in the area OLA, on which the first organic layer 761 and the first inorganic insulating layer 716 overlap each other. In detail, the first short circuit prevention pattern 810 may be disposed in the area OLA, on which the first edge area 761*b* of the first organic layer 761 and the first edge area 716*b* of the first inorganic insulating layer 716 overlap each other.

The second organic layer 762 disposed on the first conductive layers 723 may cover the first opening 770. A second width OMW2 of the second organic layer 762 may be greater than a first width OMW1 of the first organic layer 761. In other words, a second edge 762*a* of the second organic layer 762 may extend outside the first edge 761*a* of the first organic layer 761. An extending portion EXT of the second organic layer 762 may be disposed between the first edge 761*a* of the first organic layer 761 and the second edge 762*a* of the second organic layer 762.

A plurality of second conductive layers 724 may be disposed to be spaced apart from each another in the first direction (y direction). Each of the second conductive layers 724 may cross the second organic layer 762. In an exemplary embodiment, although the second conductive layers 724 are disposed in a different layer from the first conductive layers 723, the second conductive layers 724 and the first conductive layers 723 may overlap each other in plan view, along the first direction (y direction) of the substrate 701.

A second short circuit prevention pattern 820 may be disposed at the second edge 762*a* of the second organic layer 762 overlapping the second conductive layers 724. In detail, the second short circuit prevention pattern 820 may be disposed at the second edge 762*a* of the second organic layer 762 corresponding to an interval d between adjacent second conductive layers 724. The second short circuit prevention pattern 820 may be patterned along the second edge 762*a* of the second organic layer 762 extending in the first direction (y direction) of the substrate 701.

The second short circuit prevention pattern 820 may have a recessed portion, of which may be formed by removing at least a portion of the second organic layer 762 from the second edge 762*a* of the second organic layer 762. The second short circuit prevention pattern 820 may be disposed in the extending portion EXT of the second organic layer 762. The first short circuit prevention pattern 810 and the second short circuit prevention pattern 820 may be disposed to be spaced apart from each other in the second direction (x direction).

Each of the first and second short circuit prevention patterns 810 and 820 may have various patterns. For example, each of the first and second short circuit prevention patterns 810 and 820 may include at least one of a polygonal pattern, a circular pattern, an elliptic pattern, a zigzag pattern, a wavy pattern, a lattice pattern, and a serrate pattern.

Figure 9:
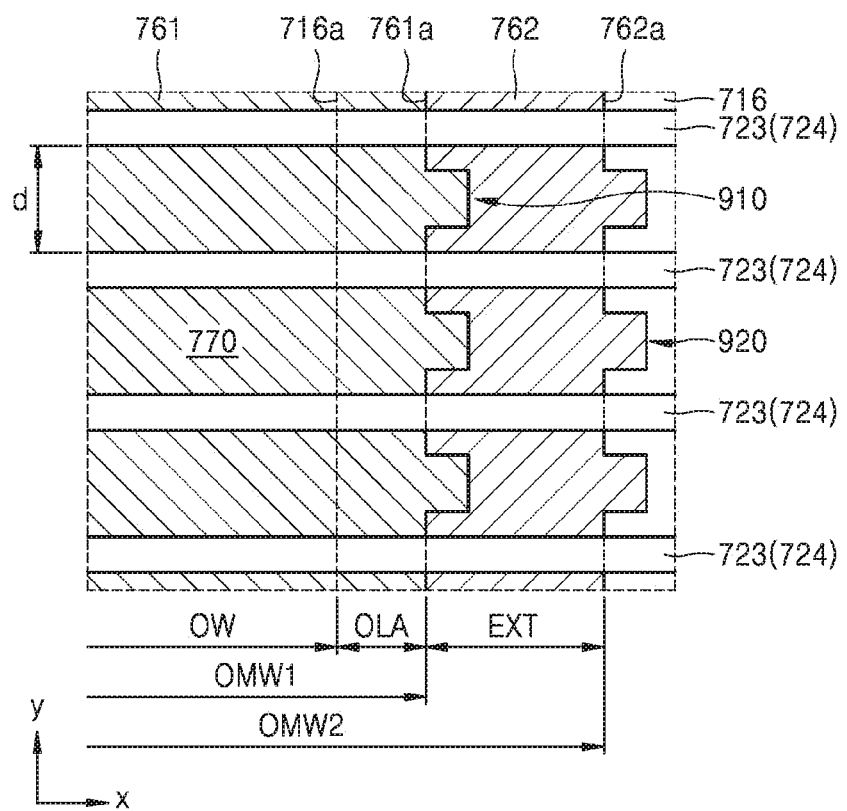
FIG. 9 is a view illustrating an area of FIG. 8 according to an exemplary embodiment.

FIG. 9 is a magnified plan view of an area of FIG. 7, according to an exemplary embodiment.

Referring to FIG. 9, a first opening 770 may be an area from which a first inorganic insulating layer 716 corresponding to the first bending area 1BA of FIG. 7 has been removed. A first organic layer 761 may cover the first opening 770. A first width OMW1 of the first organic layer 761 may be greater than a width OW of the first opening 770 in a second direction (x direction). An overlapping area OLA may be disposed between a first edge 761a of the first organic layer 761 filling the first opening 770 and a first edge 716a of the first inorganic insulating layer 716 contacting the first opening 770.

A plurality of first conductive layers 723 may be disposed to be spaced apart from each another in a first direction (y direction). A first short circuit prevention pattern 910 may be disposed at the first edge 761a of the first organic layer 761 overlapping the first conductive layers 723. In detail, the first short circuit prevention pattern 910 may be disposed in a space corresponding to an interval d between adjacent first conductive layers 723. The first short circuit prevention pattern 910 may be patterned along the first edge 761a of the first organic layer 761 extending in the first direction (y direction) of the substrate 701 of FIG. 7.

The first short circuit prevention pattern 910 may have a protrusion, in which at least a portion of the first organic layer 761 protrudes from the first edge 761a of the first organic layer 761. The first short circuit prevention pattern 910 may be a protrusion having a tetragonal shape. The first short circuit prevention pattern 910 may protrude from the first edge 761a of the first organic layer 761 in the opposite direction to the first opening 770.

A second organic layer 762 disposed on the first conductive layers 723 may cover the first opening 770. A second width OMW2 of the second organic layer 762 may be greater than a first width OMW1 of the first organic layer 761. In other words, a second edge 762a of the second organic layer 762 may extend outside the first edge 761a of the first organic layer 761. An extending portion EXT of the second organic layer 762 may be disposed between the first edge 761a of the first organic layer 761 and the second edge 762a of the second organic layer 762.

A plurality of second conductive layers 724 may be disposed to be spaced apart from each another in the first direction (y direction). Each of the second conductive layers 724 may cross the second organic layer 762. Although the second conductive layers 724 are disposed in a different layer from the first conductive layers 723, the second conductive layers 724 and the first conductive layers 723 may overlap each other in a plan view, along the first direction (y direction) of the substrate 701.

A second short circuit prevention pattern 920 may be disposed at the second edge 762a of the second organic layer 762 overlapping the second conductive layers 724. In detail, the second short circuit prevention pattern 820 may be disposed at the second edge 762a of the second organic layer 762 corresponding to an interval d between adjacent second conductive layers 724. The second short circuit prevention pattern 820 may be patterned along the second edge 762a of the second organic layer 762 extending in the first direction (y direction) of the substrate 701.

The second short circuit prevention pattern 920 may have a protrusion, in which at least a portion of the second organic layer 762 protrudes from the second edge 762a of the second organic layer 762. The first short circuit prevention pattern 910 and the second short circuit prevention pattern 920 may be disposed to be spaced apart from each other in the second direction (x direction) of the substrate 701.

Unlike the exemplary embodiments of FIGS. 8 and 9, the first conductive layers 723 and the second conductive layers 724 may not overlap each other in a plan view, along the first direction (y direction) of the substrate 701.

Figure 12:
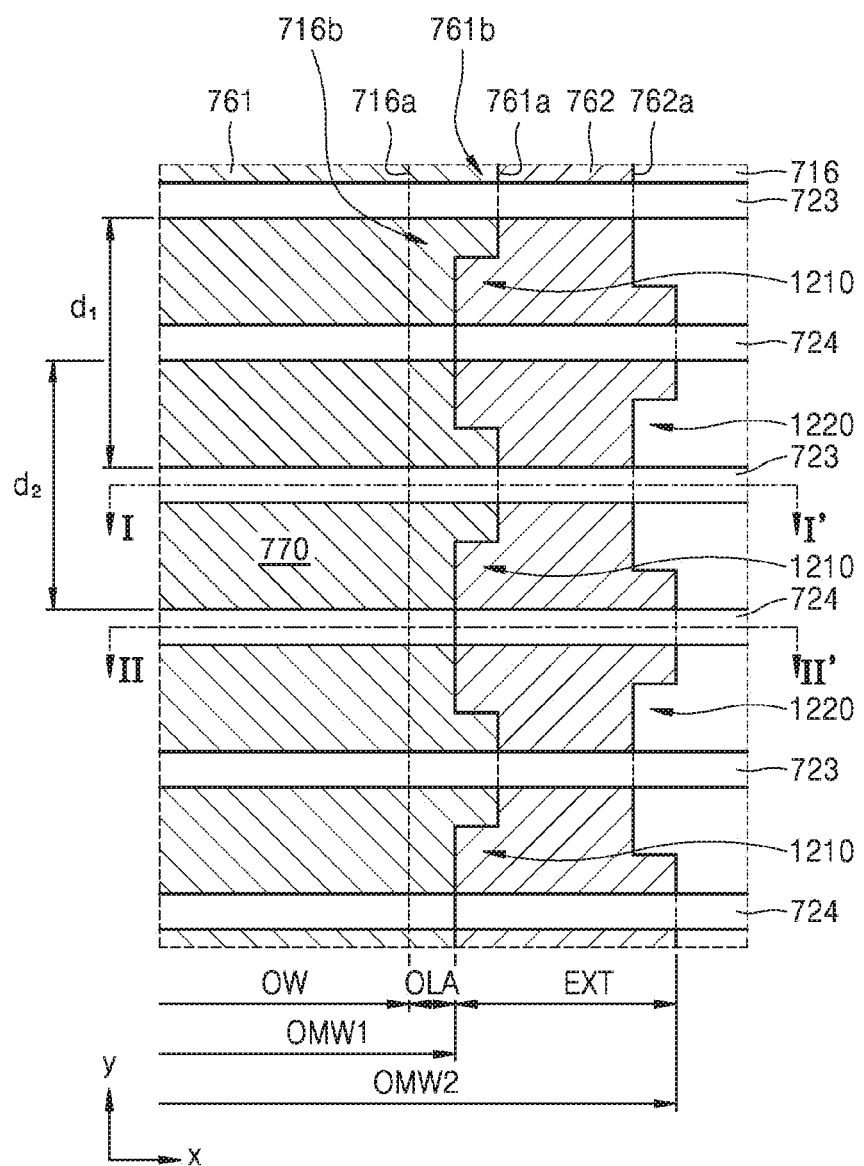
FIG. 12 is a magnified plan view of an area where conductive layers and organic layers extend from a bending area to a second area, according to an exemplary embodiment.
Figure 13A:
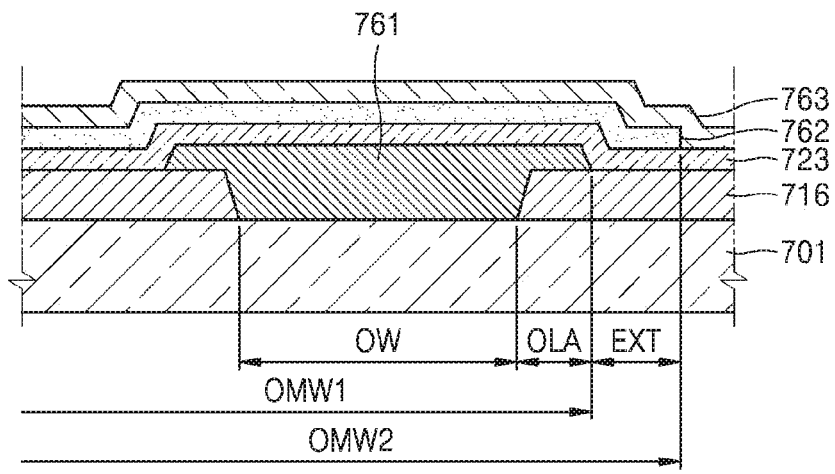
FIG. 13A is a cross-sectional view taken along line I-I' of FIG. 12.

FIG. 12 is a magnified plan view of an area of FIG. 7, where conductive layers 723 and 724 and organic layers 761 and 762 extend from a bending area 1BA to a second area 2A, according to an exemplary embodiment. FIG. 13A is a cross-sectional view taken along line I-I' of FIG. 12, and FIG. 13B is a cross-sectional view taken along line II-II' of FIG. 12.

Figure 13B:
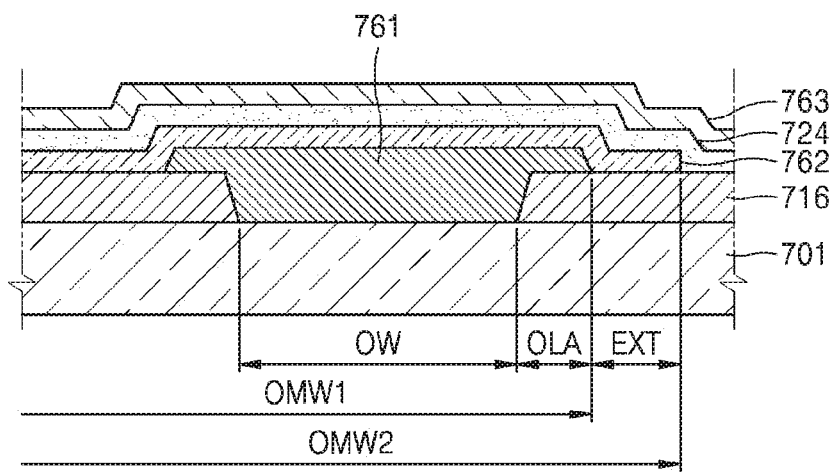
FIG. 13B is a cross-sectional view taken along line II-II' of FIG. 12.

Referring to FIGS. 12, 13A, and 13B, a first opening 770 may be an area from which a first inorganic insulating layer 716 corresponding to the first bending area 1BA of FIG. 7 has been removed. A first organic layer 761 may cover the first opening 770. A first width OMW1 of the first organic layer 761 may be greater than a width OW of the first opening 770 in a second direction (x direction). An area OLA, in which a first edge area 761b of the first organic layer 761 and a first edge area 716b of the first inorganic insulating layer 716 overlap each other, may be disposed between the ends of the first width OMW1 of the first organic layer 761 and the width OW of the first opening 770.

A plurality of first conductive layers 723 may be disposed to be spaced apart from each another in a first direction (y direction), and each of the first conductive layers 723 may cross the first organic layer 761. A first short circuit prevention pattern 1210 may be disposed at the first edge 761a of the first organic layer 761 overlapping the first conductive layers 723. In detail, the first short circuit prevention pattern 1210 may be disposed at the first edge 761a of the first organic layer 761 corresponding to a first interval d1 between adjacent first conductive layers 723. The first short circuit prevention pattern 1210 may be patterned along the first edge 761a of the first organic layer 761 extending in the first direction (y direction) of the substrate 701 of FIG. 7. The first short circuit prevention pattern 1210 may have a recessed portion, of which may be formed by removing at least a portion of the first organic layer 761 from the first edge 761a of the first organic layer 761.

A second organic layer 762 disposed on the first conductive layers 723 may cover the first opening 770. A second width OMW2 of the second organic layer 762 may be greater than a first width OMW1 of the first organic layer 761. In other words, a second edge 762a of the second organic layer 762 may extend outside the first edge 761a of the first organic layer 761. An extending portion EXT of the second organic layer 762 may be disposed between the first edge 761a of the first organic layer 761 and the second edge 762a of the second organic layer 762.

A plurality of second conductive layers 724 may be disposed to be spaced apart from each another in the first direction (y direction). Each of the second conductive layers 724 may be disposed between two adjacent first conductive layers 723. Each of the second conductive layers 724 may cross the second organic layer 762. A second short circuit prevention pattern 1220 may be disposed at the second edge 762a of the second organic layer 762 overlapping the second conductive layer 724. In detail, the second short circuit prevention pattern 1220 may be disposed at the second edge 762a of the second organic layer 762 corresponding to a second interval d2 between adjacent second conductive layers 724.

The second short circuit prevention pattern 1220 may have a recessed portion, of which may be formed by removing at least a portion of the second organic layer 762 from the second edge 762a of the second organic layer 762.

The second short circuit prevention pattern 1220 may be disposed in the extending portion EXT of the second organic layer 762.

The first short circuit prevention pattern 1210 and the second short circuit prevention pattern 1220 may be alternately arranged in the first direction (y direction) and be spaced apart from each other in the second direction (x direction). Each of the first and second short circuit prevention patterns 1210 and 1220 may be formed in various shapes. For example, each of the first and second short circuit prevention patterns 1210 and 1220 may have at least one of a polygonal pattern, a circular pattern, an elliptic pattern, a zigzag pattern, a wavy pattern, a lattice pattern, and a serrate pattern.

Unlike the exemplary embodiments of FIGS. 7, 8, 9, and 12, the first organic layer 761 may be omitted and be replaced with the second organic layer 762.

Figure 14:
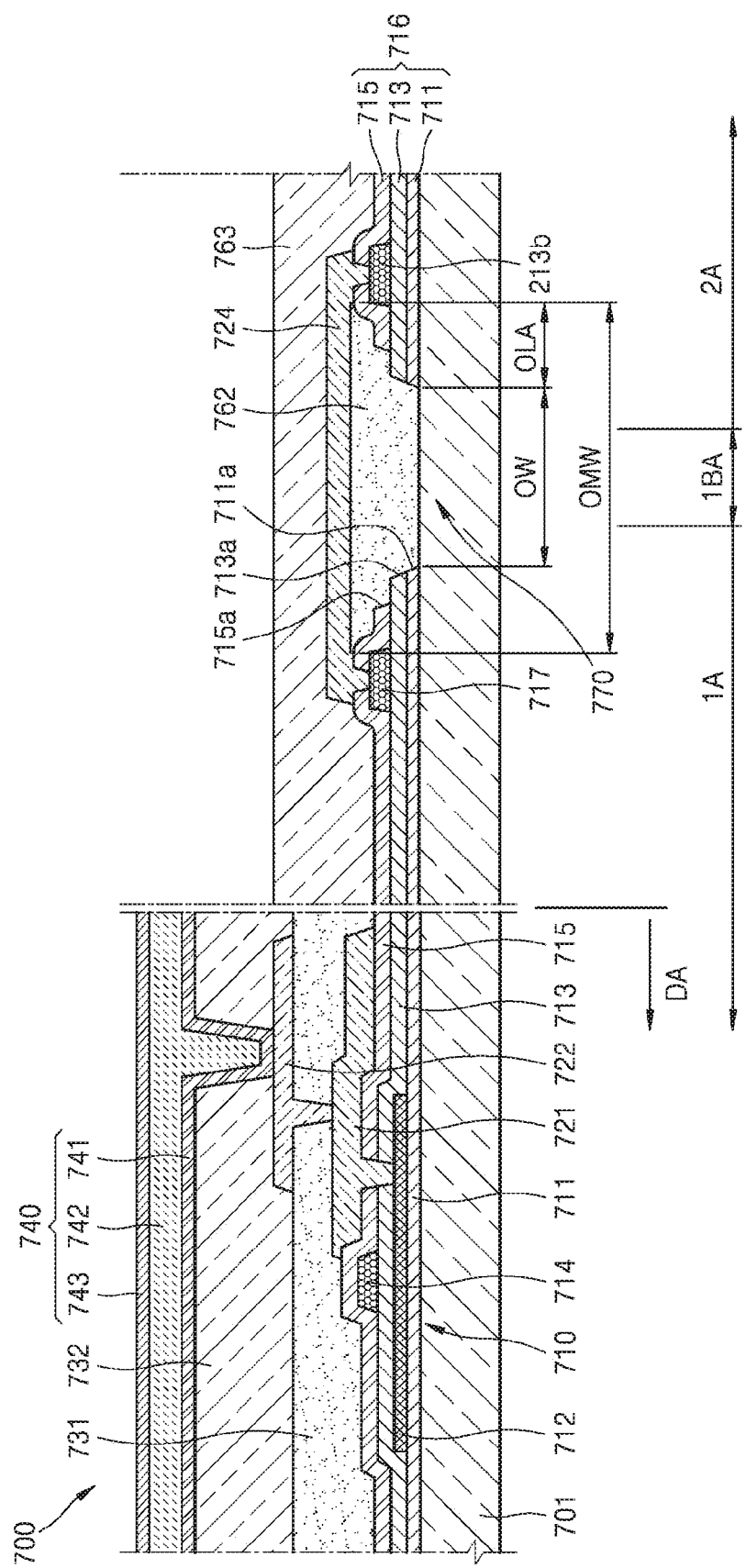
FIG. 14 is a view of an area of FIG. 7, according to an exemplary embodiment.

FIG. 14 is a cross-sectional view of a part of a display device 700 according to an exemplary embodiment.

Referring to FIG. 14, a display device 700 includes a substrate 701. The substrate 701 includes a first bending area 1BA extending in a first direction (y direction). The first bending area 1BA may be disposed between a first area 1A and a second area 2A in a second direction (x direction).

A first inorganic insulating layer 716 may have a first opening 770 corresponding to the first bending area 1BA. In detail, a buffer layer 711, a gate insulating layer 713, and an interlayer insulating layer 715 may respectively have openings 711*a*, 713*a*, and 715*a* corresponding to the first bending area 1BA. The area of the first opening 770 may be defined by the area of the opening 711*a* of the buffer layer 711.

The display device 700 includes a second organic layer 762, with which at least a portion of the first opening 770 of the first inorganic insulating layer 716 is filled. In the exemplary embodiment, the first organic layer 761 of FIG. 7 may be omitted and be replaced with a second organic layer 762.

The second organic layer 762 may cover the first opening 770. A width OMW of the second organic layer 762 may be greater than a width OW of the first opening 770 in the second direction (x direction). In an exemplary embodiment, the second organic layer 762 may include the same material as a first organic insulating layer 731 in a display area DA and be formed simultaneously with the first organic insulating layer 731.

Second conductive layers 724 may be disposed on the second organic layer 762. The second conductive layers 724 may extend from the first area 1A to the second area 2A through the first bending area 1BA. In an exemplary embodiment, the second conductive layers 724 may include the same material as a second conductive part 722 disposed in the display area DA, and be formed simultaneously with the second conductive part 722. The second conductive layers 724 may contact a third conductive part 717 via a contact hole formed in the interlayer insulating layer 715, and may serve as wiring.

A third organic layer 763 may be disposed on the second conductive layers 724. The third organic layer 763 may cover the second conductive layers 724. The third organic layer 763 may include the same material as a second organic insulating layer 732 in the display area DA, and be formed simultaneously with the second organic insulating layer 732.

The display apparatus according to one or more embodiments may prevent a short circuit between adjacent conductive layers disposed on a substrate.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device comprising:
a substrate comprising a bending area arranged between a first area and a second area, the substrate being configured to be bent around a bending axis extending in a first direction;
a first inorganic insulating layer disposed on the substrate and having a first opening overlapping the bending area;
a first organic layer disposed in the first opening; and
a plurality of first conductive layers disposed on the first organic layer and extending from the first area to the second area through the bending area,
wherein at least one edge of the first organic layer overlapping the first conductive layers comprises at least one first short circuit prevention pattern.

2. The display device of claim 1, wherein:
the first conductive layers are spaced apart from each other in the first direction; and
the at least one first short circuit prevention pattern is disposed between the first conductive layers.

3. The display device of claim 2, wherein the at least one first short circuit prevention pattern is patterned along a first edge of the first organic layer extending in the first direction.

4. The display device of claim 3, wherein the at least one first short circuit prevention pattern comprises a recessed portion formed at the first edge of the first organic layer.

5. The display device of claim 4, wherein:
a first edge area of the first inorganic insulating layer contacts the first opening and at least partially overlaps the first edge area of the first organic layer; and
the at least one first short circuit prevention pattern is disposed in the overlapping area.

6. The display device of claim 3, wherein the at least one first short circuit prevention pattern comprises a protrusion protruding from the first edge of the first organic layer.

7. The display device of claim 6, wherein:
a first edge area of the first inorganic insulating layer contacts the first opening and overlaps the first edge area of the first organic layer; and
the at least one first short circuit prevention pattern protrudes from the first edge of the first organic layer in an opposite direction to the first opening.

8. The display device of claim 3, wherein the at least one first short circuit prevention pattern has at least one of a polygonal pattern, a circular pattern, an elliptic pattern, a zigzag pattern, a wavy pattern, a lattice pattern, and a serrate pattern.

9. The display device of claim 3, further comprising:
a second organic layer disposed on the first conductive layers; and
a plurality of second conductive layers disposed on the second organic layer and spaced apart from each other in the first direction,
wherein a second edge of the second organic layer comprises at least one second short circuit prevention pattern.

10. The display device of claim 9, wherein the at least one first short circuit prevention pattern and the at least one second short circuit prevention pattern each comprises a recessed portion formed at the first edge of the first organic layer and the second edge of the second organic layer, respectively.

11. The display device of claim 10, wherein:
a first edge area of the first inorganic insulating layer contacts the first opening and at least partially overlaps the first edge area of the first organic layer;
the second edge of the second organic layer extends outside the first edge of the first organic layer; and
the at least one first short circuit prevention pattern and the at least one second short circuit prevention pattern are spaced apart from each other in a second direction perpendicular to the first direction.

12. The display device of claim 9, wherein the at least one first short circuit prevention pattern and the at least one second short circuit prevention pattern each comprises a protrusion protruding from the first edge of the first organic layer and from the second edge of the second organic layer, respectively.

13. The display device of claim 12, wherein:
a first edge area of the first inorganic insulating layer contacts the first opening and at least partially overlaps the first edge area of the first organic layer;
the second edge of the second organic layer extends outside the first edge of the first organic layer; and
the at least one first short circuit prevention pattern and the at least one second short circuit prevention pattern protrude in an opposite direction to the first opening and are spaced apart from each other in a second direction perpendicular to the first direction.

14. The display device of claim 9, wherein each of the at least one first short circuit prevention pattern and the at least one second short circuit prevention pattern comprises at least one of a polygonal pattern, a circular pattern, an elliptic pattern, a zigzag pattern, a wavy pattern, a lattice pattern, and a serrate pattern.

15. The display device of claim 9, wherein the first conductive layers and the second conductive layers overlap each other in a plan view.

16. The display device of claim 9, wherein the first conductive layers and the second conductive layers are alternately arranged in the first direction.

17. The display device of claim 9, further comprising:
a thin-film transistor disposed in at least one of the first area and the second area, the thin-film transistor comprising a source electrode, a drain electrode, and a gate electrode; and
a thin film encapsulation layer disposed in the first area,
wherein at least one of the first conductive layers and the second conductive layers are disposed in the same layer as at least one of the source electrode, the drain electrode, and the gate electrode.

18. The display device of claim 17, wherein at least one of the first conductive layers and the second conductive layers comprise a wiring line connected to a display element.

19. The display device of claim 1, wherein a width of the first organic layer is greater than a width of the first opening in a second direction perpendicular to the first direction.

20. The display device of claim 1, wherein the first organic layer covers the first opening.

* * * * *